United States Patent
Basceri et al.

(10) Patent No.: US 6,682,969 B1
(45) Date of Patent: Jan. 27, 2004

(54) TOP ELECTRODE IN A STRONGLY OXIDIZING ENVIRONMENT

(75) Inventors: Cem Basceri, Boise, ID (US); Howard E. Rhodes, Boise, ID (US); Gurtej Sandhu, Boise, ID (US); F. Daniel Gealy, Quna, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 332 days.

(21) Appl. No.: 09/652,863

(22) Filed: Aug. 31, 2000

(51) Int. Cl.$^7$ ............... H01L 21/00; H01L 21/8242; H01L 21/20; H01L 21/44
(52) U.S. Cl. ............ 438/240; 438/3; 438/253; 438/255; 438/396; 438/398; 438/658
(58) Field of Search ............... 257/306; 438/3, 438/240, 253, 254, 255, 396, 397, 398, 658

(56) References Cited

U.S. PATENT DOCUMENTS

| | | | |
|---|---|---|---|
| 5,191,510 A | | 3/1993 | Huffman |
| 5,814,852 A | * | 9/1998 | Sandhu et al. ............ 257/310 |
| 6,153,490 A | * | 11/2000 | Xing et al. ............... 438/396 |
| 6,211,035 B1 | | 4/2001 | Moise et al. |
| 6,297,085 B1 | | 10/2001 | Aoki et al. |
| 6,309,894 B1 | | 10/2001 | Miki et al. |
| 6,420,192 B2 | * | 7/2002 | Miki et al. .................... 438/3 |
| 6,475,854 B2 | * | 11/2002 | Narwankar et al. ........ 438/238 |
| 6,495,412 B1 | * | 12/2002 | Zhu et al. .................. 438/240 |
| 6,541,813 B1 | * | 4/2003 | Niwa et al. ............... 257/310 |

FOREIGN PATENT DOCUMENTS

EP   0 557 937 A1   9/1993

* cited by examiner

Primary Examiner—Caridad Everhart
Assistant Examiner—Chuong A Luu
(74) Attorney, Agent, or Firm—Knobbe, Martens, Olson & Bear, LLP

(57) ABSTRACT

An improved charge storing device and methods for providing the same, the charge storing device comprising a conductor-insulator-conductor (CIC) sandwich. The CIC sandwich comprises a first conducting layer deposited on a semiconductor integrated circuit. The CIC sandwich further comprises a first insulating layer deposited over the first conducting layer in a flush manner. The first insulating layer comprises a structure having a plurality of oxygen cites and a plurality of oxygen atoms that partially fill the oxygen cites, wherein the unfilled oxygen cites define a concentration of oxygen vacancies. The CIC sandwich further comprises a second conducting layer deposited over the first insulating layer in a strongly oxidizing ambient so as to reduce the concentration of oxygen vacancies in the first insulating layer, so as to provide an oxygen-rich interface layer between the first insulating layer and the second conducting layer, and so as to trap a plurality of oxygen atoms within the second conducting layer. The oxygen-rich interface layer and second conducting layer act as oxygen vacancy sinks for absorbing migrating oxygen vacancies that originate from the first insulating layer to thereby reduce the concentration of oxygen vacancies in the first insulating layer and to thereby reduce the buildup of oxygen vacancies at the interface layer. Thus, the first insulating layer provides an increased dielectric constant and an increased resistance to current flowing therethrough so as to increase the capacitance of the CIC sandwich and so as to reduce leakage currents flowing through the CIC sandwich.

35 Claims, 4 Drawing Sheets

TOP ELECTRODE IN A STRONGLY OXIDIZING ENVIRONMENT

BACKGROUND OF THE INVENTION

1. Field of the Invention

The present invention generally relates to semiconductor integrated circuits and, in particular, relates to oxide dielectric materials having reduced oxygen vacancies and methods for providing the same.

2. Description of the Related Art

Dielectric materials are extensively relied upon by the semiconductor industry to form charge storing circuit elements within integrated circuits. For example, a typical capacitor structure within an integrated circuit comprises an insulating dielectric layer sandwiched between a lower and upper conducting electrode. This provides the capacitor structure with a desired capacitance, C, that varies proportionally with the dielectric constant, k, of the dielectric layer and the area, A, of the electrodes. Furthermore, some types of memory devices, such as Dynamic Random Access Memory (DRAM) devices, comprise a plurality of these capacitor structures such that the continued presence or absence of a detectable charge on a single capacitor structure indicates the state of a single memory cell of the memory device.

However, due to the limitations of known manufacturing methods, the typical dielectric layer often suffers from a substantially large concentration of oxygen vacancy defects. In particular, an oxygen vacancy exists whenever the crystal structure of an oxide dielectric is missing an oxygen atom. Unfortunately, the presence of oxygen vacancies within the dielectric causes the dielectric layer to have a decreased dielectric constant as well as a decreased electrical resistance.

Thus, a capacitor structure formed of such a dielectric layer usually provides a decreased capacitance, thereby reducing the charge deposited on the electrodes of the capacitor structure in response to a specific voltage differential applied across it electrodes. Moreover, since relatively large leakage currents flow through the dielectric layer of the capacitor structure, the capacitor structures discharges in a relatively short period of time. Consequently, when used in DRAM devices, such capacitor structures require a relatively high refresh rate and, therefore, lengthen the time required to access data from such devices.

Unfortunately, the problems associated with oxygen vacancies within dielectric materials are becoming more apparent as integrated circuits are formed with increasingly smaller circuit elements. For example, high density DRAM devices requiring a large number of capacitor structures demand the electrodes of each capacitor structure to have a relatively small area. Thus, in order to provide a sufficient capacitance in response to the reduced area, A, of the electrodes, dielectric materials having a relatively large dielectric constant, k, otherwise known as high-k dielectric materials, are required. However, known high-k dielectric materials, such as tantalum pentoxide ($Ta_2O_5$), barium strontium titanate (BST), barium titanate (BT) lead zirconium titanate (PZT), and strontium bismuth tantalate (SBT), require the presence of oxygen atoms throughout their crystal structures. Furthermore, the dielectric constant and the electrical resistance of these high-k materials are especially sensitive to the presence of oxygen vacancies. Thus, these capacitor structures are more likely to be formed with an insufficient capacitance for developing a detectable charge as well as an insufficient resistance for maintaining the detectable charge.

To address the problem of oxygen vacancies in dielectric materials, manufacturers often subject DRAM integrated circuits to re-oxidation anneals. For example, DRAM integrated circuits are usually exposed to a first annealing process which heats the integrated circuit in an oxidizing environment subsequent to the deposition of the dielectric material and prior to the deposition of the upper electrode so as to source oxygen atoms to the exposed dielectric material to thereby reduce the concentration of oxygen deficiencies. However, since the oxygen deficiencies are often deeply positioned within the oxide dielectric layer, a relatively large concentration of oxygen deficiencies remain. Furthermore, during the deposition of the upper electrode layer, a substantial portion of the remaining oxygen deficiencies are often drawn toward the upper electrode which often forms an oxygen deficiency-rich interface layer in-between the dielectric layer and the upper electrode. Unfortunately, the formation of this defective interface layer causes the capacitor structure to suffer from a disproportionately small dielectric constant as well as a disproportionately small resistance to leakage current.

In an effort to repair the defective interface layer between the dielectric layer and the upper electrode layer, manufacturers often subject DRAM integrated circuits to a second re-oxidation annealing process in an oxidizing environment subsequent to the deposition of the upper electrode. However, the upper electrode essentially acts as a barrier which inhibits oxygen atoms from diffusing into the underlying dielectric layer. Thus, the effectiveness of the second annealing process is substantially limited.

From the foregoing, therefore, it will be appreciated that there is a need for an improved capacitor structure formed in an integrated circuit. In particular, there is a need for the capacitor structure to include a dielectric material with a reduced concentration of oxygen deficiencies. Furthermore, there is a need for the capacitor structure to have a reduced buildup of oxygen deficiencies at an interface layer between the dielectric material and an upper electrode layer of the capacitor structure. To this end, there is a need for an improved method of depositing the upper electrode above the dielectric material so as to reduce the concentration of oxygen deficiencies throughout the dielectric material.

SUMMARY OF THE INVENTION

The aforementioned needs are satisfied by the preferred embodiments of the improved conductor-insulator-conductor (CIC) sandwich of the present invention. In one embodiment, a method of forming an improved CIC sandwich for an integrated circuit is provided. In particular, the method comprises depositing a first conducting layer on the integrated circuit. The method further comprises depositing a first insulating layer in contact with the first conducting layer, wherein the first insulating layer comprises a plurality of oxygen atoms in a structure defining a first concentration of oxygen vacancies. The method further comprises depositing a second conducting layer in contact with the first insulating layer in a strongly oxidizing ambient so as to reduce the concentration of oxygen vacancies in the first insulating layer from the first concentration, wherein reducing the concentration of oxygen vacancies in the first insulating layer provides the first insulating layer with improved electrical characteristics.

In another embodiment, a method of forming a memory cell for a DRAM integrated circuit having an improved CIC sandwich is provided. In particular, the method comprises forming a first transistor gate on a substrate, depositing a first insulating layer over the first transistor gate, and forming a conductive plug that extends from an active region of the first transistor gate through the first insulating layer. The method further comprises forming a structural layer over the first insulating layer, and forming a via that extends into the structural layer so as to expose the conductive plug. The method further comprises depositing a first conducting layer over the structural layer so as to coat the interior surfaces of the via with the first conducting layer and so as to electrically couple the conductive plug with the first conducting layer. The method further comprises depositing a second insulating layer over the first conducting layer, wherein the second insulating layer comprises a plurality of oxygen atoms in a structure defining a first concentration of oxygen vacancies. The method further comprises depositing a second conducting layer over the second insulating layer in a strongly oxidizing ambient so as to source oxygen atoms to the second insulating layer so that the concentration of oxygen vacancies of the second insulating layer is reduced from the first concentration.

In another embodiment, the aforementioned needs are satisfied by an integrated circuit comprising an improved conductor-insulator-conductor (CIC) sandwich. In particular, the CIC sandwich comprises a first conducting layer deposited over the integrated circuit. The CIC sandwich further comprises a first insulating layer deposited over the first conducting layer, wherein the first insulating layer comprises a structure having a plurality of oxygen sites partially filled by a plurality of oxygen atoms. Furthermore, the unfilled oxygen sites define a concentration of oxygen vacancies. The CIC sandwich further comprises a second conducting layer deposited over the first insulating layer. The CIC sandwich further comprises an oxygen-rich interface layer interposed between the first insulating layer and the second conducting layer. Specifically, the oxygen-rich interface layer acts as a sink for absorbing oxygen vacancies that migrate from the first insulating layer so as to reduce the buildup of oxygen vacancies at the interface layer and so as to reduce the concentration of oxygen vacancies of the first insulating layer.

From the foregoing, it should be apparent that preferred embodiments of the CIC sandwich and the methods for providing such enable the CIC sandwich to have improved electrical characteristics. In particular, the reduced concentration of oxygen vacancies within the CIC sandwich enable the CIC sandwich to have an increased dielectric constant as well as an increased resistance to leakage current flowing through the CIC sandwich. Thus, the preferred embodiments of the CIC sandwich of the present invention are more suitable for use in charge storing devices than CIC sandwiches known in the art. These and other objects and advantages of the present invention will become more apparent from the following description taken in conjunction with the accompanying drawings.

DETAILED DESCRIPTION OF THE PREFERRED EMBODIMENT

Reference will now be made to the drawings wherein like numerals refer to like parts throughout. While illustrated in the context of a dynamic random access memory (DRAM) cell, embodiments of the invention can be used to improve a wide range of products and processes. For example, the invention can be used to improve materials with high dielectric constants, metal-oxide-semiconductor structures, metal-oxide-metal structures and the like.

Figure 1:
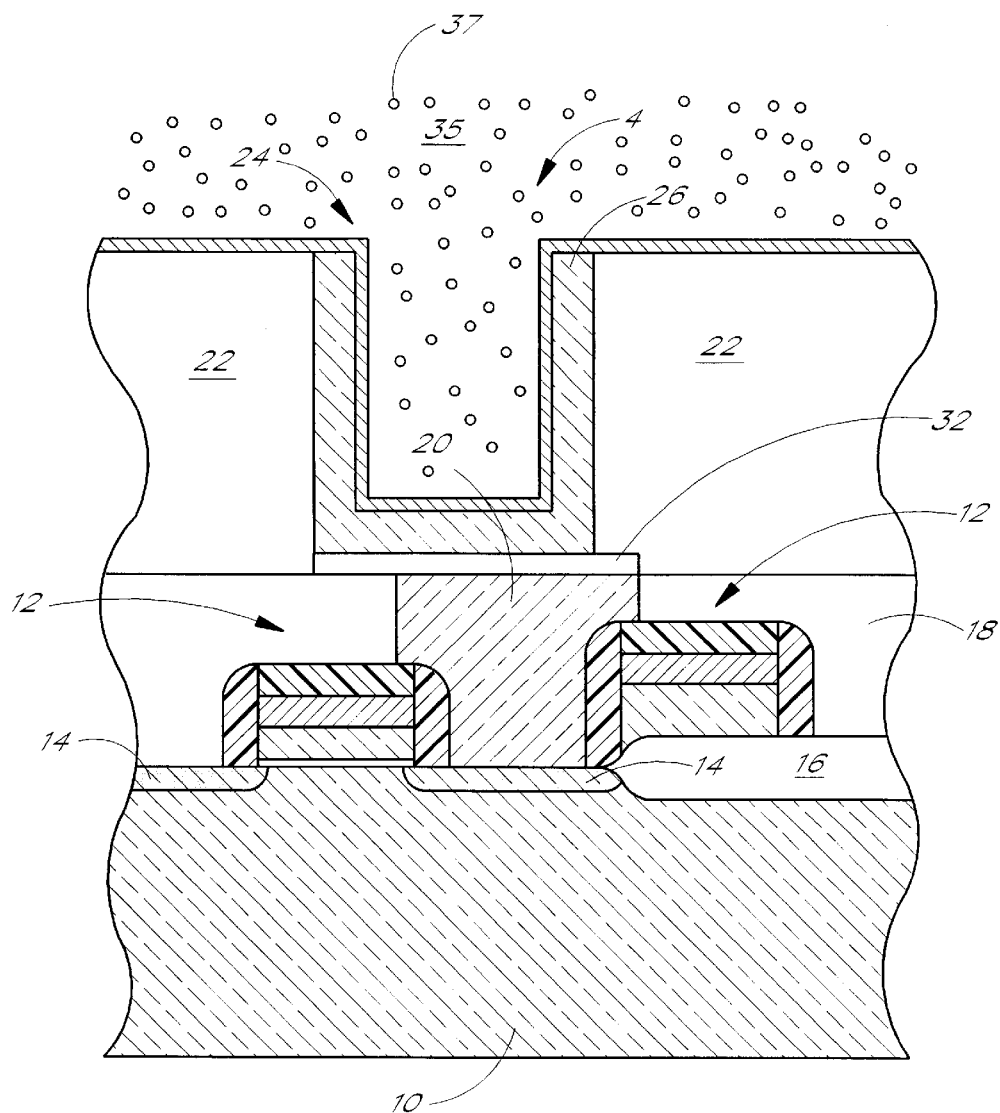
FIG. 1 is a schematic cross-section of one embodiment of a partially fabricated memory cell.

FIG. 1 illustrates a partially fabricated memory cell 4 formed within and over a semiconductor substrate 10, in accordance with one embodiment of the present invention. While the illustrated substrate 10 comprises an intrinsically doped monocrystalline silicon wafer, it will be understood by one of skill in the art of semiconductor fabrication that the "substrate" in other arrangements can comprise other forms of semiconductor layers which include active or operable portions of semiconductor devices.

A plurality of transistor gate electrodes 12 overlie the substrate 10, adjacent transistor active areas 14 within the substrate 10. It will be understood that several transistors are formed across a memory array within a DRAM circuit or chip. Field oxide elements 16 isolate the active areas 14 of different transistors. In the illustrated embodiment of FIG. 1, the field oxide elements 16 are formed using the well known local oxidation of silicon process (LOCOS). However, it is to be understood that the field oxide elements 16 could be formed using other processes such as shallow trench isolation (STI). In one embodiment, the width of the gates are preferably less than about 0.25 microns ($\mu$m).

In one embodiment, the field oxide elements 16 are formed using the well known LOCOS (Local Oxidation of Silicon) technique. However, in another embodiment, the field oxide elements 16 could be fabricated by another process, such as STI (Shallow Trench Issolation).

A first insulating layer 18 is shown covering the gate electrodes 12. Generally, this insulating layer 18 comprises a form of oxide, such as borophosphosilicate glass (BPSG). Depending upon the presence or absence of other circuit elements, the first insulating layer 18 typically has a thickness between about 0.15 $\mu$m to 1.5 $\mu$m. For example, certain DRAM circuit designs call for "buried" digit lines running below the cell capacitors, such that a thicker insulating layer is required to electrically isolated the digit line from the underlying transistors and the overlying capacitors.

A conductive contact 20 is shown extending through the first insulating layer 18 to electrically contact an active area 14 between gate electrodes. In the illustrated embodiment, the material of the contact 20 comprises conductively doped polycrystalline silicon or polysilicon, which advantageously can be deposited into deep, narrow contact vias with good step coverage by chemical vapor deposition (CVD). In accordance with industry terminology, the conductive contact shall be referred to as a "poly plug" 20. In another embodiment, the poly plug 20 can include a variety of conductors including tungsten (W), aluminum (Al) or the like. As described in further detail below, the poly plug 20 has a reduced level of oxidation that occurs when removing oxygen vacancies from the memory cell 4.

The barrier layer 32 advantageously acts as a diffusion barrier to reduce oxidation of the underlying poly plug 20. The barrier layer 32 may comprise tantalum (Ta), tantalum nitride (TaN), tantalum silicon nitride (TaSiN), titanium nitride (TiN), titanium aluminum nitride (TiAlN), titanium silicon nitride (TiSiN), tungsten nitride ($WN_x$), tungsten silicon nitride (WSiN), silicon nitride (SiN), molybdenum (Mo) or the like. However, the skilled artisan will recognize that a wide range of materials can be used to form the barrier layer 32. The barrier layer 32 can be formed by nitridizing a metallic film, such as Ta, Mo, Ti, and W, deposited on the poly plug 20 or by chemical vapor deposition (CVD), metal organic chemical vapor deposition (MOCVD), low temperature sputtering or the like. In one embodiment, the barrier layer 32 is approximately 10 angstroms (Å) to approximately 1000 or more angstroms (Å) thick. In certain other embodiments, the barrier layer 32 is not used.

A structural layer 22 is then formed over the first insulating layer 18 and the barrier layer 32. As will be better understood from the methods described below, this structural layer 22 need not become a permanent part of the circuit. Accordingly, the skilled artisan has a great deal of flexibility in the selection of this material. Preferably, the structural layer 22 is selectively etchable relative to the underlying first insulating layer 18. In one embodiment, the structural layer 22 is BPSG. The surface area and thus the capacitance of the memory cell 4 is influenced by the thickness of the structural layer 22. For the illustrated circuit, using 0.25 $\mu$m resolution, the structural layer 22 preferably has a thickness of greater than about 0.4 $\mu$m, more preferably between about 0.4 $\mu$m and 2.0 $\mu$m.

A via 24 is formed in the structural layer 22 to expose the underlying poly plug 20, and a conductive layer 26 is deposited over the structural layer 22 and into the via 24 to coat the inner surfaces of the via 24 and to make electrical contact with the poly plug 20. The top of the structural layer 22, and the portion of the conductive layer 26 overlying the structural layer 22, can then be planarized to leave the conductive layer 26 isolated within the via 24, as shown in FIG. 1. Such planarization can be accomplished by mechanical abrasion, preferably chemically aided by etchants in a slurry in a chemical mechanical planarization or polishing (CMP) process.

The conductive layer 26 serves as a bottom electrode of the memory cell 4, and can comprise a conductively doped polysilicon, hemispherical grain (HSG) polysilicon, platinum (Pt), ruthenium (Ru), ruthenium oxide ($RuO_x$), iridium (Ir), iridium oxide ($IrO_x$), palladium (Pd), tungsten (W) tungsten nitride ($WN_x$), tantalum nitride (TaN), titanium nitride (TiN), titanium oxygen nitride (TiON) or the like. The illustrated conductive layer 26 thus takes on a three-dimensional folding shape that is of greater surface area than the area of the substrate 10 which the memory cell 4 occupies. Other methods of increasing surface area can include creating a rough surface on the conductive layer 26, creating multiple concentric container shapes for one memory cell, and creating a bottom electrode stud. The skilled artisan will find application for the processes and materials discussed below for any of a number of capacitor configurations.

The conductive layer 26 can be deposited by chemical vapor deposition (CVD), Low Pressure Chemical Vapor Deposition (LPCVD), metal organic chemical vapor deposition (MOCVD), plasma enhanced chemical vapor deposition (PECVD), physical vapor deposition (PVD), electroplating, or the like. While the thickness of the conductive layer 26 is approximately 100 angstroms (Å) to approximately 1000 (Å), the skilled artisan will recognize that the thickness of the conductive layer 26 can vary over a wide variety of ranges.

As shown in FIG. 1, the memory cell 4 further comprises an insulating layer 34 which is deposited above the conductive layer 26 and above the structural layer 22. As will be described in greater detail below in connection with FIGS. 2 through 4, the insulating layer 34 forms a part of a conductor -insulator- conductor (CIC) structure 30 of the memory cell 4.

The insulating layer 34 is an insulator that provides electrical insulation. In one embodiment of the invention, the insulating layer 34 is a conventional dielectric material such as silicon nitride. In another embodiment, the insulating layer 34 is a material with a high dielectric constant. Materials having high dielectric constants greater than 9 are to be distinguished from conventional dielectric materials such as silicon nitride which has a dielectric constant of approximately 7. The high constant dielectric materials typically comprise inorganic non-metallic oxides such as aluminum oxide ($Al_2O_3$), tantalum pentoxide ($Ta_2O_5$), oxide paraelectric materials, and ferroelectric materials, including by way of example, barium strontium titanate (($BaSr)TiO_3$ or BST), strontium titanate (ST), barium titanate (BT), lead zirconium titanate (PZT), strontium bismuth tantalate (SBT), or the like.

In the preferred embodiments, the insulating layer 34 comprises material in a crystalline state. However, it will be appreciated that the insulating layer 34 could comprise material in a non-crystalline state. For example, in one embodiment, the insulating layer 34 could comprise an amorphous dielectric material.

In one embodiment, the dielectric 34 is deposited by alternating current (AC) sputtering at a temperature range of approximately 50° C. to approximately 700° C. A target material can comprise a stoichiometric composition of powdered materials. The thickness of such a dielectric layer is preferably in the range of approximately 20 Å to approximately 500 Å thick. Other deposition techniques such as CVD, LPCVD, PECVD or MOCVD can be utilized. For example, in one embodiment, the dielectric 34 comprises tantalum pentoxide and is between approximately 40 Å and approximately 120 Å thick. Preferably, the tantalum pentoxide is approximately 70 Å thick. The dielectric constant (k) of tantalum pentoxide is 25 to 50, and when doped with silicon can increase up to 130. As is known in the art, tantalum pentoxide can be formed by chemical vapor deposition, using an organometallic precursor.

In another embodiment, the dielectric 34 comprises barium strontium titanate that is between approximately 100 Å and approximately 500 Å thick. Preferably, the barium strontium titanate is approximately 200 Å to approximately 300 Å thick. While the dielectric constant (k) of the barium strontium titanate varies from about 100 to 600, depending upon the phase and thickness of the material, the preferred dielectric 34 has a dielectric constant of about 300. As is known in the art, barium strontium titanate is preferably deposited by chemical vapor deposition techniques comprising reacting volatile complexes containing barium (Ba), strontium (Sr and titanium (Ti) in an oxygen ambient.

Figure 2:
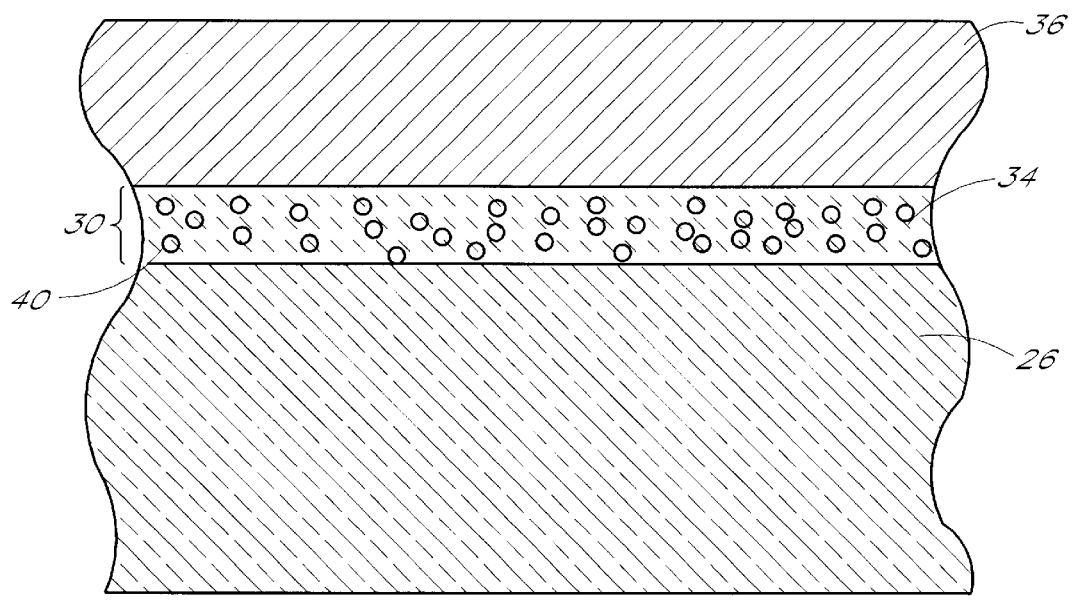
FIG. 2 is a schematic cross-section of a conductor-insulator-conductor structure of FIG. 1.

FIG. 2 illustrates the conductor-insulator-conductor (CIC) structure 30 of the memory cell 4 of FIG. 1. The CIC 30 comprises the conductive layer 26, the dielectric 34, and the second conductive layer 36. The conductive layer 26 is hereinafter referred to as the bottom electrode 26 and the conductive layer 36 is hereinafter referred to as the upper electrode 36.

During the deposition of the dielectric 34, a plurality of oxygen vacancies 40 often develop wherein oxygen atoms are missing at various sites throughout the dielectric 34. For example, the dielectric 34 comprising tantalum pentoxide or barium strontium titanate may contain defects where missing oxygen atoms deform their crystalline structures and yield poor dielectric properties such as lower dielectric constants and higher leakage currents. As will be explained in more detail below, one embodiment of the invention reduces the oxygen vacancies in the dielectric 34 by exposing the CIC 30 to a strongly oxidizing ambient having an increased concentration of oxygen atoms 37 while the second conductive layer 36 is deposited above the dielectric 34.

After depositing the dielectric 34, the upper electrode 36 is deposited over the dielectric 34. The upper electrode 36 typically comprises platinum (Pt), ruthenium (Ru), ruthenium oxide ($RuO_x$), iridium (Ir), iridium oxide ($IrO_x$), palladium (Pd), tungsten (W), tungsten nitride (WN), tantalum nitride (TaN), titanium nitride (TiN), titanium oxygen nitride (TiON), or the like. A suitable deposition process is sputtering, CVD, LPCVD, PECVD, MOCVD or the like. The upper electrode 36 is preferably deposited to a thickness range of approximately 100 Å to approximately 2000 Å.

In prior art devices, an electrode is typically deposited in an ambient having only enough oxygen to provide the electrode with a stable stoichiometry. For example, if the electrode is formed of $IrO_x$, the oxygen concentration is typically chosen so that stoichemetrically stable $IrO_2$ is formed. However, to decrease the concentration of oxygen vacancies 40 in the dielectric 34, the upper electrode 36 of the preferred embodiment of the present invention is deposited over the dielectric 34 in the strongly oxidizing ambient 35. As a result, the upper electrode 36 is highly oxidized such that the quantity of oxygen atoms within the upper electrode is greater than that which is required for stoicheometric stability. For example, in one embodiment, the upper electrode 36 is formed of $IrO_x$ wherein x is greater than 2.0 and less than 2.5 such that the electrical properties of the upper electrode 36 are not substantially affected by the excess oxygen atoms.

It will be appreciated that depositing the upper electrode 36 in the strongly oxidizing ambient 35 provides many advantages as will now be described in connection with FIG. 3. In particular, since the dielectric 34 is initially exposed to the ambient 35 and since the ambient 35 comprises the relatively high concentration of oxygen atoms 37, a relatively large number of oxygen atoms immediately diffuse into the dielectric 34. Thus, a relatively large number of oxygen atoms from the ambient 35 combine with the oxygen vacancies 40 in the dielectric 34 so as to provide a reduced concentration of oxygen vacancies 40 in the dielectric 34. Accordingly, the reduced concentration of oxygen vacancies 40 in the dielectric 34 provide the CIC 30 with increased capacitance and decreased leakage currents.

Another advantage provided by depositing the upper electrode 36 in the strongly oxidizing ambient 35 is the formation of an oxygen-rich interface layer 42 between the dielectric 34 and the upper electrode 36. In particular, early in the process of depositing the upper electrode 36, a relatively large number of oxygen atoms 37 from the strongly oxidizing ambient 35 engage with the exposed surface of the dielectric 34 and are subsequently trapped by the overlying upper electrode 36 so as to form the layer 42 which acts as an oxygen vacancy sink. Consequently, in the event that some of the oxygen vacancies 40 of the dielectric layer 34 migrate toward the interface layer 42, the migrating oxygen vacancies 40 will likely combine with the oxygen of the interface layer 42. This results in a substantial cancellation of the migrating vacancies 40 and, thus, reduces the likelihood that the migrating oxygen vacancies 40 will accumulate at the interface layer 42. Accordingly, since crystalline defects at the interface layer 42 are largely due to the buildup of oxygen vacancies, the reduced buildup of oxygen vacancies provides increased capacitance and decreased leakage resistance.

Yet another advantage provided by depositing the upper electrode 36 in the strongly oxidizing ambient 35 is the trapping of oxygen atoms at a plurality of oxygen-rich regions 44 throughout the upper electrode 36. In particular, the trapped oxygen atoms of the regions 44 in the upper electrode 36 provide an increased capacity for absorbing oxygen vacancies that migrate into the upper electrode 36. Thus, since these oxygen vacancies are no longer able to migrate back toward the dielectric 34, the trapped oxygen atoms of the regions 44 of the upper electrode 36 assist in further providing the CIC 30 with an increased capacitance and an increased resistance to leakage currents.

Still yet another advantage provided by depositing the upper electrode 36 in the strongly oxidizing ambient 35 is that of reduced manufacturing time. In particular, since depositing the upper electrode 36 in the strongly oxidizing ambient 35 provides the CIC 30 with the reduced concentration of oxygen vacancies 40, the need for conventional annealing processes designed to reduce the oxygen vacancies 40 is reduced. Thus, in embodiments that do not utilize an annealing process to further reduce the concentration of oxygen vacancies 40, the memory cell 4 can be manufactured in less time.

Figure 4:
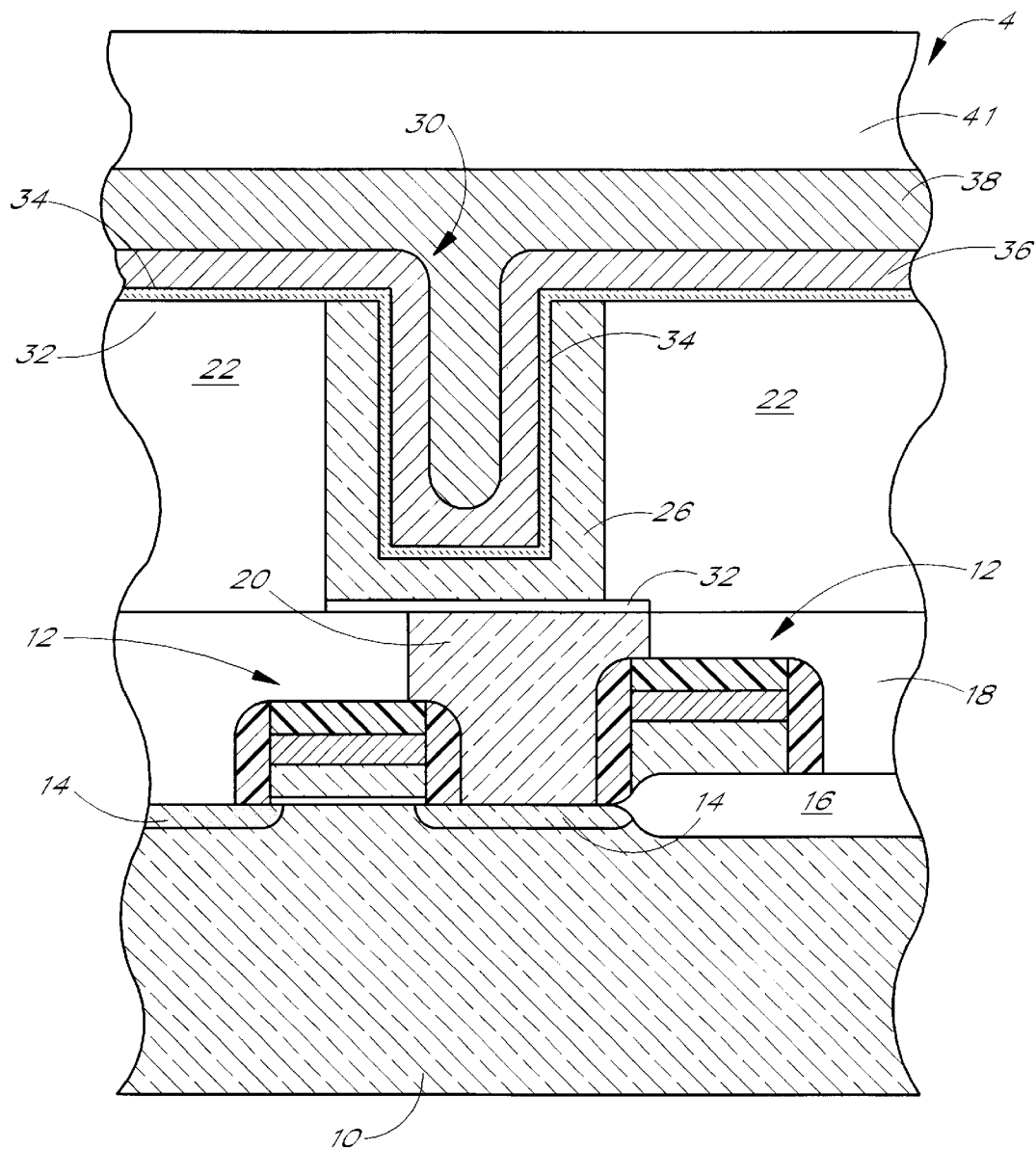
FIG. 4 is a schematic cross-section of the memory cell of FIG. 1 further incorporating the conductor-insulator-conductor structure of FIG. 2 with an overlying dielectric.

With reference now to FIG. 4, the memory cell 4 is shown with the completed capacitor structure 30. A third conductive layer 38 may exist above the upper electrode 36. Preferably the third conductive layer 38 forms a part of the top electrode 36. Exemplary materials for the third conductive layer 38 include polysilicon, tungsten, tungsten nitride ($WN_x$), and titanium nitride (TiN).

An interlevel dielectric (ILD) 41 has also been formed over the upper electrode 36. Typically, the ILD 41 comprises a form of oxide, such as borophosphosilicate glass (BPSG). Deposition of the BPSG may be followed by a reflow anneal step for better step coverage and avoiding keyholes, as well as to densify the layer. The reflow is conducted by heating the wafer to temperatures of approximately 550° C. to 900° C. If not separately annealed before this point, the deposited amorphous dielectric 34 can be converted to a crystalline phase during this high temperature reflow. Although not shown, the skilled artisan will appreciate that contacts are created through the BPSG 41 to connect the top electrode 36, 38 to wiring formed above or within the BPSG 41.

Figure 3:
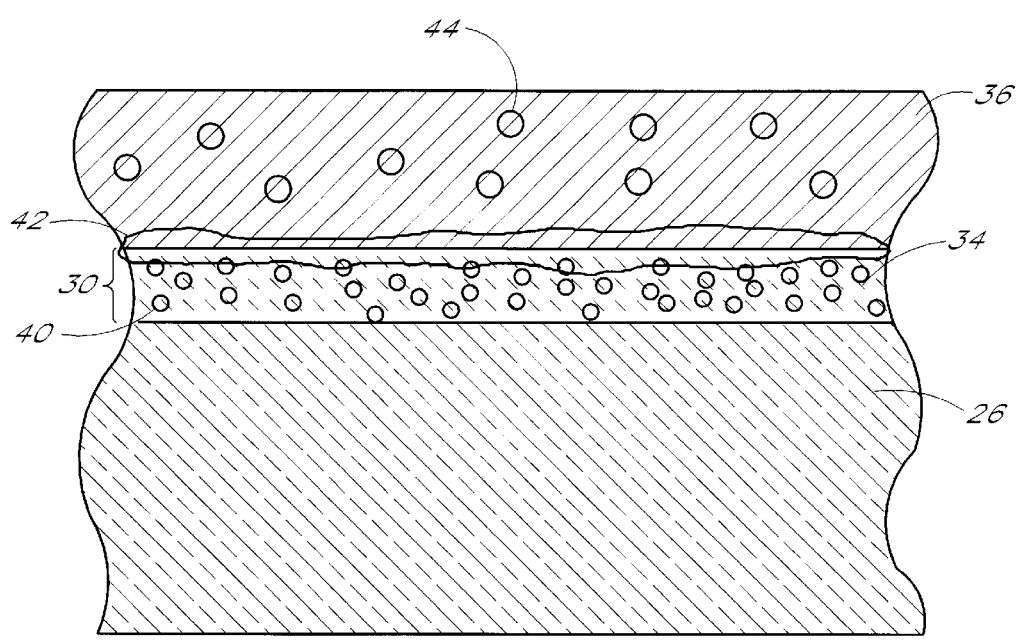
FIG. 3 is the schematic cross-section of FIG. 2 illustrating the presence of oxygen vacancies and trapped oxygen atoms within the conductor-insulator-conductor structure.

To enhance the removal of the oxygen vacancies 40 from the dielectric layer 34, it will be appreciated that the CIC 30 could be exposed to an additional processing step whereby the oxygen vacancies 38 are induced to migrate toward the interface layer 42 (FIG. 3). In particular, in one embodiment, the memory cell 4 is exposed to an electric field in a well known manner that urges a portion of the remaining oxygen vacancies 40 in the dielectric layer 34 to migrate toward the interface layer 42. Accordingly, the oxygen-rich interface layer 42 subsequently absorbs the displaced oxygen vacancies, thereby preventing the buildup of oxygen vacancies at the interface layer 42 and further reducing the concentration of oxygen vacancies 38 within the dielectric 34.

Thus, it will be appreciated that the preferred embodiments of the CIC 30 of the present invention provide improved capacitance and reduced leakage currents. Such improvements are realized by exposing the dielectric 34 of the CIC 30 to the strongly oxidizing ambient 35 during the deposition process of the upper electrode 36. This reduces the concentration of oxygen vacancies 40 of the dielectric 34 to thereby increase the dielectric constant and the resistance of the dielectric 34.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. A method of forming an improved conductor-insulator-conductor (CIC) sandwich for an integrated circuit, the method comprising:

depositing a first conducting layer on the integrated circuit;

depositing a first insulating layer adjacent the first conducting layer, wherein the first insulating layer defines a structure having a first concentration of oxygen vacancies; and depositing a second conducting layer adjacent the first insulating layer in a strongly oxidizing ambient selected so as to diffuse at least a portion of the oxygen atoms into the first insulating layer to thereby reduce the concentration of oxygen vacancies in the first insulating layer from the first concentration and so as to create an oxygen rich insulating layer at the interface between the second conducting layer and the first insulating layer that subsequently absorbs the displaced oxygen vacancies migrating out of the first insulating layer, wherein reducing the concentration of oxygen vacancies in the first insulating layer provides the first insulating layer with improved electrical characteristics.

2. The method of claim 1, wherein depositing a first conducting layer on the integrated circuit comprises depositing a material selected from the group consisting of conductively doped polysilicon, hemispherical grain (HSG) polysilicon, platinum (Pt), ruthenium (Ru), ruthenium oxide ($RuO_x$), iridium (Ir), iridium oxide ($TrO_x$), palladium (Pd), tungsten (W) tungsten nitride ($WN_x$), tantalum nitride (TaN), titanium nitride (TiN), and titanium oxygen nitride (TiON).

3. The method of claim 2, wherein depositing a first conducting layer on the integrated circuit further comprises depositing the first conducting layer using a deposition method selected from the group consisting of chemical vapor deposition (CVD), Low Pressure Chemical Vapor Deposition (LPCVD), metal organic chemical vapor deposition (MOCVD), and plasma enhanced chemical vapor deposition (PECVD).

4. The method of claim 3, wherein depositing a first conducting layer on the integrated circuit further comprises depositing the first conducting layer with a thickness that ranges between 100 angstroms (Å) and 1000 (Å).

5. The method of claim 1, wherein depositing a first insulating layer adjacent the first conducting layer comprises depositing a low-k material selected from the group consisting of silicon dioxide and silicon nitride.

6. The method of claim 1, wherein depositing a first insulating layer adjacent the first conducting layer comprises depositing a high-k material selected from the group consisting of tantalum pentoxide ($Ta_2O_5$) oxide paraelectric materials, aluminum oxide ($Al_2O_3$), barium strontium titanate (($BaSr)TiO_3$ and BST), strontium titanate (ST), barium titanate (BT), lead zirconium titanate (PZT), and strontium bismuth tantalate (SBT).

7. The method of claim 6, wherein depositing a first insulating layer adjacent the first conducting layer further comprises depositing the first layer using alternating current (AC) sputtering at a temperature range of approximately 50° C. to approximately 700° C.

8. The method of claim 7, wherein depositing a first insulating layer adjacent the first conducting layer further comprises depositing the first insulating with a thickness in the range of approximately 20 Å to approximately 500 Å.

9. The method of claim 6, wherein depositing a first insulating layer adjacent the first conducting layer further comprises depositing the first layer using a deposition method selected from the group consisting of CVD, LPCVD, PECVD and MOCVD.

10. The method of claim 1, wherein depositing a second conducting layer adjacent the first insulating layer comprises depositing a material selected from the group consisting of platinum (Pt), ruthenium (Ru), ruthenium oxide ($RuO_x$), iridium (Ir), iridium oxide ($IrO_x$), palladium (Pd), tungsten (W), tungsten nitride (WN), tantalum nitride (TaN), titanium nitride (TiN), and titanium oxygen nitride (TiON).

11. The method of claim 10, wherein depositing a second conducting layer adjacent the first insulating layer further comprises depositing a second conducting layer using a deposition process selected from the group consisting of CVD, LPCVD, PECVD, and MOCVD.

12. The method of claim 11, wherein depositing a second conducting layer adjacent the first insulating layer further comprises depositing a second conducting layer having a thickness in the range of approximately 100 Å to approximately 2000 Å.

13. The method of claim 1, wherein depositing a second conducting layer adjacent the first insulating layer in a strongly oxidizing ambient results in the second conducting layer being highly oxidized.

14. The method of claim 13, wherein the second conducting layer comprises a quantity of oxygen atoms that is greater than that which is required for stoichiometric stability.

15. The method of claim 14, wherein the second conducting layer comprises $IrO_x$ such that x is greater than 2.0 and less than 2.5.

16. The method of claim 1, wherein depositing a second conducting layer adjacent the first insulating layer in a strongly oxidizing ambient forms an oxygen rich interface layer between the first insulating layer and the second conducting layer, said oxygen rich interface layer absorbing mobile oxygen vacancies.

17. The method of claim 16, further comprising inducing a portion of the oxygen vacancies within the first insulating layer to migrate toward the oxygen-rich interface layer.

18. The method of claim 1, wherein depositing a second conducting layer adjacent the first insulating layer in a strongly oxidizing ambient causes oxygen-rich regions to form at a plurality of locations throughout the second conducting layer, said regions absorbing mobile oxygen vacancies.

19. The method of claim 1, wherein depositing a first insulating layer adjacent the first conducting layer comprises depositing a crystalline structure.

20. A method of forming a capacitor above an integrated circuit element having at least one conductive contact, the method comprising:

depositing a barrier layer on the integrated circuit element so as to insulate the conductive contact of the integrated circuit;

depositing a lower electrode on the barrier layer so as to interpose the barrier layer between the conductive contact and the lower electrode;

depositing an insulating layer adjacent the lower electrode so as to overlie the lower electrode, wherein the insulating layer defines a dielectric structure having a plurality of oxygen vacancies; and depositing an upper electrode on the insulating layer in an oxygen ambient selected to have a plurality of oxygen atoms so as to form a highly oxidized upper electrode that overlies the insulating layer wherein the highly oxidized upper electrode includes an oxygen rich interface layer at the interface between the upper electrode and the insulating layer that subsequently absorbs the displaced oxygen vacancies migrating out of the insulating layer and to replace at least a portion of the plurality of oxygen vacancies in the dielectric structure with at least a portion of the oxygen atoms to thereby increase the capacitance of the capacitor.

21. The method of claim 20, wherein depositing an upper electrode includes depositing an upper electrode with a quantity of oxygen atoms that is greater than that which is required for stoichiometric stability.

22. The method of claim 20, wherein depositing an upper electrode on the insulating layer in an ambient having a plurality of oxygen atoms forms an oxygen rich interface layer between the upper electrode and the insulating layer such that the oxygen rich interface layer absorbs mobile oxygen vacancies from the insulating layer.

23. The method of claim 22, further comprising inducing a portion of the oxygen vacancies within the first insulating layer to migrate toward the oxygen-rich interface layer.

24. The method of claim 20, wherein depositing an upper electrode on the insulating layer in an ambient having a plurality of oxygen atoms causes oxygen-rich regions to form at a plurality of locations throughout the upper electrode such that the oxygen-rich regions absorb mobile oxygen vacancies from the insulating layer.

25. The method of claim 20, wherein depositing an upper electrode on the insulating layer in an ambient having a plurality of oxygen atoms immediately diffuses at least a portion of the oxygen atoms in the ambient into the insulating layer so as to replace at least a portion of the oxygen vacancies with the diffused oxygen atoms.

26. The method of claim 20, wherein forming a capacitor above an integrated circuit element comprises forming a capacitor above a DRAM memory cell.

27. The method of claim 26, wherein depositing a barrier layer on the integrated circuit element includes insulating the DRAM memory cell from the capacitor.

28. A method of forming a capacitor structure for an integrated circuit, the method comprising:

depositing a lower electrode layer on the integrated circuit;

depositing a dielectric layer adjacent the lower electrode layer so as to overlie the lower electrode layer, wherein the dielectric layer comprises a first concentration of oxygen deficiencies; and depositing an upper electrode layer adjacent the dielectric layer so as to overlie the dielectric layer, wherein the upper electrode layer is deposited in a strongly oxidizing ambient selected so as to simultaneously form a highly oxidized upper electrode layer with an oxygen rich interface layer at the interface between the dielectric layer and the upper electrode that subsequently absorbs the displaced oxygen vacancies migrating out of the dielectric layer while oxidizing the dielectric layer to thereby reduce the concentration of oxygen deficiencies in the dielectric layer from the first concentration, and wherein reducing the concentration of oxygen deficiencies in the dielectric layer provides the capacitor structure with increased capacitance.

29. The method of claim 28, wherein forming a capacitor structure includes forming a conductor-insulator-conductor (CIC) sandwich.

30. The method of claim 29, wherein depositing the upper electrode layer in a strongly oxidizing ambient includes depositing a plurality of oxygen atoms in the upper electrode layer so as to form an oxidized upper electrode layer.

31. The method of claim 30, wherein depositing the plurality of oxygen atoms in the upper electrode layer includes forming oxygen-rich regions in the upper electrode layer.

32. The method of claim 31, wherein depositing the plurality of oxygen atoms in the upper electrode layer includes diffusing at least a portion of the oxygen atoms into the insulating layer so as to replace at least a portion of the oxygen deficiencies with the diffused oxygen atoms.

33. The method of claim 28, wherein forming a capacitor structure for an integrated circuit includes forming a capacitor structure for a DRAM memory cell.

34. The method of claim 33, wherein the method further comprises forming a barrier layer between the DRAM memory cell and the lower electrode so as to insulate the DRAM memory cell from the capacitor structure.

35. The method of claim 28, wherein depositing the upper electrode layer includes depositing an upper electrode with a quantity of oxygen atoms that is greater than that which is required for stoichiometric stability.

\* \* \* \* \*